United States Patent [19]

Kosaka et al.

[11] Patent Number: 5,031,019
[45] Date of Patent: Jul. 9, 1991

[54] METHOD FOR MANUFACTURING A SEMICONDUCTOR DEVICE HAVING ISOLATED ISLANDS AND ITS RESULTING STRUCTURE

[75] Inventors: Daisuke Kosaka, Takarazuka; Yoshinori Ueda, Osaka; Tetsuo Hikawa, Takarazuka; Masami Nishikawa, Takatsuki, all of Japan

[73] Assignee: Ricoh Company, Ltd., Tokyo, Japan

[21] Appl. No.: 199,860

[22] Filed: May 27, 1988

[30] Foreign Application Priority Data

May 30, 1987 [JP] Japan .................................. 62-136945

[51] Int. Cl.⁵ .......................................... H01L 27/02
[52] U.S. Cl. ...................................... 357/43; 357/35; 357/44; 357/48
[58] Field of Search ................... 357/35, 43, 44, 48

[56] References Cited

U.S. PATENT DOCUMENTS 4,825,275  4/1989  Tomassetti ............................ 357/48

Primary Examiner—Edward J. Wojciechowicz
Attorney, Agent, or Firm—Cooper & Dunham

[57] ABSTRACT

A method for manufacturing a Bi-CMOS device by preparing both of bipolar and MOS standard cells in a library is provided. A substrate of a first conductivity type is provided and a plurality of buried layers of a second conductivity type are formed on selected locations of the substrate. Then an epitaxial layer of the first conductivity type is formed on the substrate covering the buried layers. Then a plurality of wells of the second conductivity type are formed in the epitaxial layer such that each of the wells extends through the epitaxial layer from the top surface to at least a portion of the corresponding buried layer to thereby define a plurality of electrically isolated islands in the epitaxial layer. Then a bipolar transistor is formed in at least one of the islands with a MOS transistor formed in at least another of the islands.

6 Claims, 6 Drawing Sheets

METHOD FOR MANUFACTURING A SEMICONDUCTOR DEVICE HAVING ISOLATED ISLANDS AND ITS RESULTING STRUCTURE

BACKGROUND OF THE INVENTION

1. Field of the Invention

This invention generally relates to a method for manufacturing a semiconductor device and its resulting structure, and in particular to a method for manufacturing a semiconductor device having both bipolar and MOS transistors on the same substrate according to a standard cell scheme and its resulting structure.

2. Description of the Prior Art

A standard cell scheme is a design method for realizing a semiconductor integrated circuit device having a desired logic function by using a library of standard cells which have been previously designed manually or by an electronic computer and verified. In accordance with such a standard cell method, mainly semiconductor integrated circuit devices including MOS transistors have been manufactured. In custom ICs, semiconductor integrated circuit devices having both analog circuits and digital circuits are required. In designing such custom ICs, bipolar transistor sections are not in the form of standard cell format.

FIG. 2 illustrates a typical prior art Bi-CMOS semiconductor integrated circuit device having both bipolar and CMOS transistors. As shown, the illustrated structure includes a P type silicon substrate 1 on which a P type epitaxial layer 2 is formed. In the region where a bipolar NPN transistor is formed, an N+ type buried layer 3 is formed between the substrate 1 and the epitaxial layer 2. In the region where an NPN transistor is formed, an N type well 4a is formed as a collector and a P type base 7 is formed within the well 4a with an N type emitter 8 being formed within the base 7 to thereby define an NPN transistor 15. In the region where a PMOS transistor is formed, an N type well 4b is formed in the epitaxial layer 2 and a pair of P+ type diffusion regions 6, 6 is formed at the surface of the well 4b with a gate electrode 10a comprised of a polysilicon layer being formed above a channel region with a gate oxide film sandwiched therebetween to thereby define a PMOS transistor 14. In the region where an NMOS transistor is formed, a pair of N+ type diffusion regions 5, 5 is formed at the surface of the epitaxial layer 2 and a gate electrode 10b is formed from a polysilicon layer above a channel region with a gate oxide film sandwiched therebetween to thereby define an NMOS transistor 13. Also shown in FIG. 2 are a field oxide film 9, a PSG film 11 and an aluminum interconnection 12.

In a semiconductor integrated circuit device having both analog and digital circuits as shown in FIG. 2, a supply voltage for an analog circuit section including the bipolar transistor 15 may differ from a supply voltage for a digital circuit section including the NMOS and PMOS transistors 13 and 14. For example, the supply voltage for the analog circuit may be ±5V, whereas the supply voltage for the digital circuit may be in the range between −5V and 0V. In the case of exchanging data between such a semiconductor integrated circuit device and another digital semiconductor integrated circuit device, since digital semiconductor integrated circuit devices are normally operated at the voltage ranging from 0V to 5V, there arises a problem because of a discrepancy in the supply voltage between the two semiconductor integrated circuit devices.

In such a case, use has been conventionally made of a level shifter to shift the voltage level of a signal to match the voltage levels between the respective signals. However, the provision of such a level shifter tends to slow down the overall operation and thus it tends to limit the high speed operation. In addition, the provision of such a level shifter also occupies an area on the substrate, which tends to lower the degree of integration in a semiconductor integrated circuit device.

In a semiconductor device having both bipolar and MOS transistors, since power supply voltages typically differ between the two, even if the MOS transistor section has been conventionally formed in a standard cell format, there is a difficulty in forming the bipolar transistor section in the form of a standard cell format in a manner similar to a cell library of MOS transistors. Thus, there has not been proposed to design a Bi-CMOS custom IC according to a full standard cell scheme. As a result, the bipolar transistor section must be designed and fabricated according to an individual custom design method, so that designing and fabrication of a Bi-CMOS custom IC tends to be time consuming and expensive. In addition, since use cannot be made of verified cells in fabrication, the yield also tends to be lower.

SUMMARY OF THE INVENTION

In accordance with the present invention, there is provided a method for manufacturing a semiconductor device having both bipolar and MOS transistor and having a structure in that power supply voltages can be set independently between the bipolar and MOS sections. In the preferred embodiment of the present invention, a semiconductor device includes a substrate of a first conductivity type and an epitaxial layer of the first conductivity type formed on the substrate to a predetermined thickness. One or more buried layers of a second conductivity are formed between the substrate and the epitaxial layers at selected locations, and one or more wells of the second conductivity type are formed in the epitaxial layer extending through the epitaxialy layer and reaching corresponding buried layers to thereby define isolated islands in the epitaxial layer. An isolated island may be defined by such a well or by a portion of the epitaxial layer which is surrounded by a buried layer and one or more wells. With this structure, since there are provided a plurality of isolated islands in the epitaxial layer, which are isolated each other and also from the substrate, any desired power supply voltage may be set in each of the isolated islands.

With the above-described structure, both of the bipolar and MOS transistor sections can be designed and fabricated according to a standard cell scheme, and thus a Bi-CMOS device can be designed and fabricated according to a full standard cell scheme.

It is therefore a primary object of the present invention to obviate the disadvantages of the prior art and to provide an improved method for manufacturing a semiconductor device having both bipolar and MOS transistors and a resulting structure.

Another object of the present invention is to provide an improved method for designing and manufacturing a Bi-CMOS device according to a full standard cell scheme and its resulting structure.

A further object of the present invention is to provide an improved semiconductor device having both bipolar and MOS transistors which can be manufactured easily and expeditiously at low cost.

A still further object of the present invention is to provide an improved Bi-CMOS semiconductor device capable of using different power supply voltage levels between its bipolar and MOS sections.

A still further object of the present invention is to provide an improved Bi-CMOS semiconductor device having a high degree of freedom in designing.

Other objects, advantages and novel features of the present invention will become apparent from the following detailed description of the invention when considered in conjunction with the accompanying drawings.

DESCRIPTION OF THE PREFERRED EMBODIMENTS

Figure 1A:
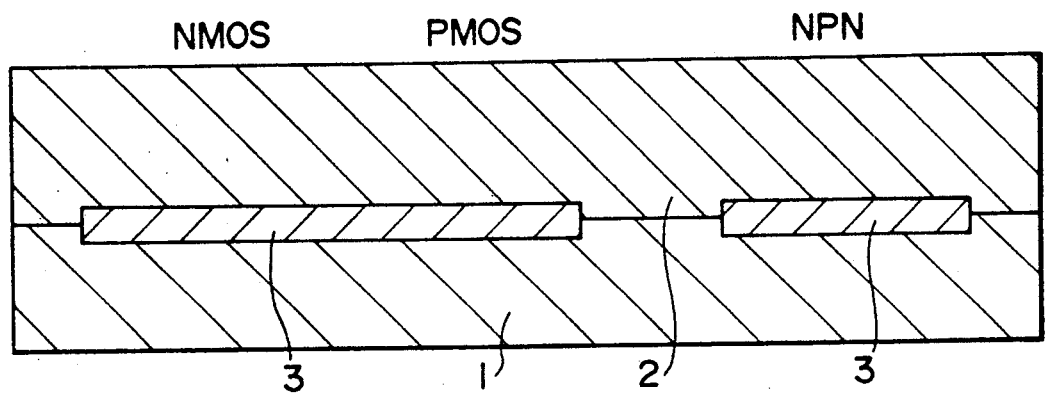
FIGS. 1a through 1c are schematic, cross sectional views showing steps of a method for manufacturing a semiconductor device having both of bipolar and MOS transistors in accordance with one embodiment of the present invention.
Figure 1B:
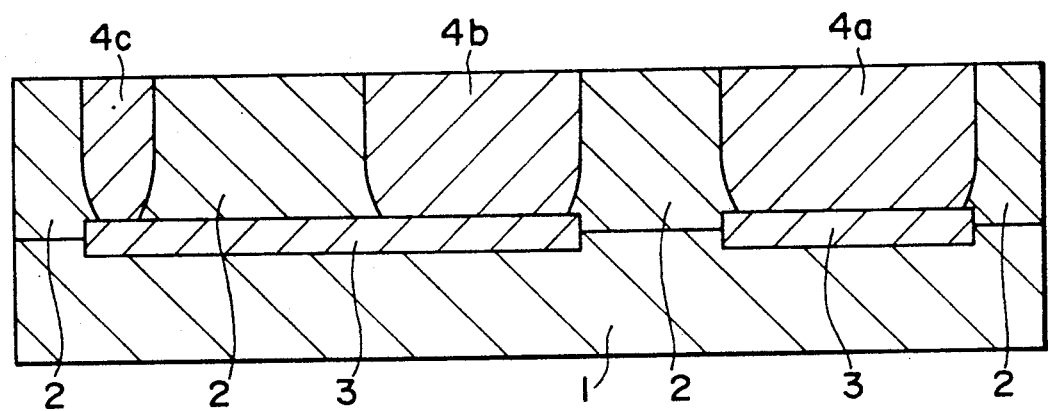
Figure 1C:
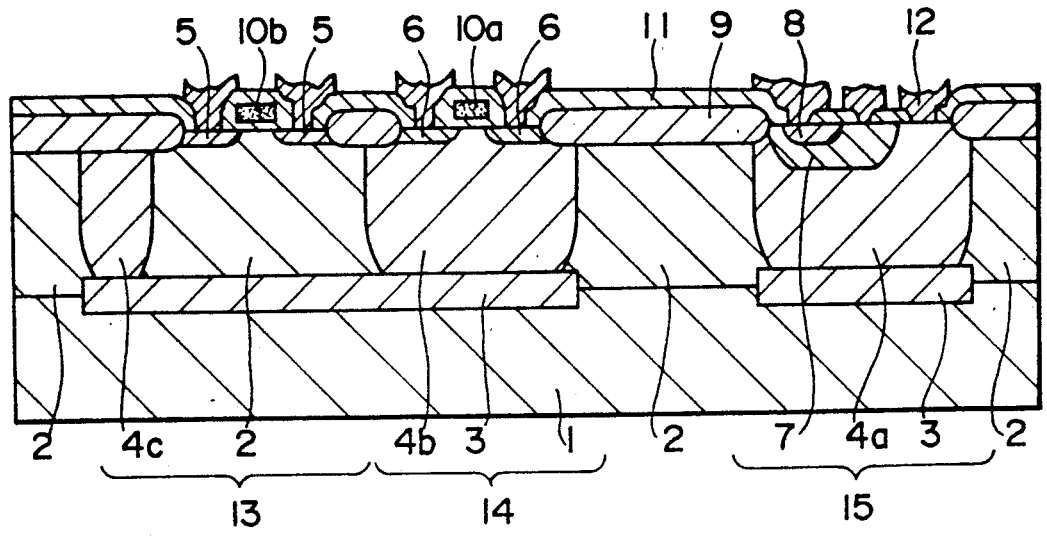
Figure 2:
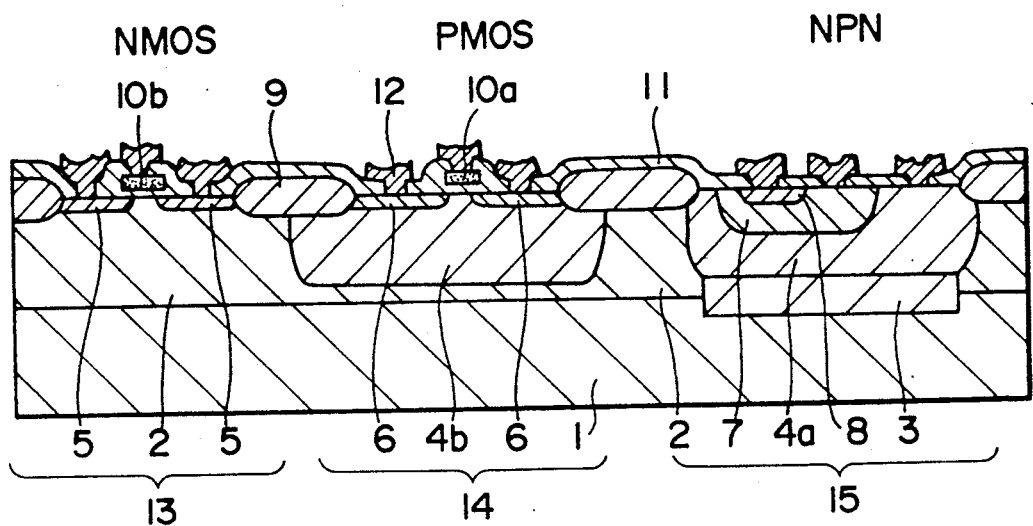
FIG. 2 is a schematic, cross sectional view showing the structure of a typical prior art semiconductor device having both bipolar and MOS transistors.

Referring now to FIGS. 1a through 1c, there is shown a sequence of steps for manufacturing a semiconductor device having both bipolar and MOS transistors in accordance with one embodiment of the present invention. As shown, there is provided a P type silicon substrate 1 and an N+ buried layer 3 is selectively formed on the substrate 1 using a photolithographic technique and a diffusion technique. The buried layer 3 is formed at such a location where a CMOS structure is to be defined and at such a location where a bipolar transistor (NPN transistor in the illustrated embodiment) is to be defined. Then, a P type epitaxial silicon layer 2 is formed on the substrate 1 and the buried layers 3 to a thickness of 5 microns or more, preferably in the order of 7.5±0.7 microns, to thereby define the structure shown in FIG. 1a.

Then N type impurities are ion-implanted into selected regions of the epitaxial layer 2 and driven to define N type wells 4a, 4b and 4c as shown in FIG. 1b. The well 4a is formed in that portion of the epitaxial layer 2 which is located above the right-hand buried layer 3 and it extends from the top surface of the epitaxial layer 2 to the buried layer 3. The well 4a is a well in which an NPN transistor is to be formed. The well 4b is formed in the epitaxial layer 2 as located above the right-hand half of the left-hand buried layer 3 and it extends from the top surface of the epitaxial layer 2 to the buried layer 3. The well 4b is a well in which a PMOS transistor is to be formed. And, the well 4c is formed in the epitaxial layer 2 near the left-hand edge of the left-hand buried layer 3 and it extends from the top surface of the epitaxial layer 2 to the buried layer 3. The well 4c is an isolation well between a CMOS section and the surrounding epitaxial layer 2 so that no transistor is formed in the well 4c.

Thereafter, as shown in FIG. 1c, by applying an ordinary manufacturing process, a base 7 and an emitter 8 are formed in the well 4a to thereby define an NPN transistor 15. A gate electrode 10a of polysilicon and a pair of P+ diffusion regions 6 and 6 are formed in the well 4b to thereby define a PMOS transistor. In the epitaxial island surrounded by the wells 4b, 4c and the buried layer 3 is formed a gate electrode 10b of polysilicon and a pair of N+ diffusion regions 5 and 5 to thereby define an NMOS transistor therein. It is to be noted that the structure shown in FIG. 1c also includes a field oxide film 9, a PSG film 11 and an aluminum interconnection pattern 12.

As shown in FIG. 1c, a CMOS section containing the PMOS and NMOS transistors is isolated from the rest of the epitaxial layer 2 and the substrate 1 by the wells 4b and 4c and the buried layer 3 because the PMOS transistor is formed inside of the well 4b which is isolated from the rest of the epitaxial layer 2 by a PN junction and from the substrate 1 by a portion of the underlying buried layer 3 and the NMOS transistor is formed inside of an isolated island of the epitaxial which is surrounded by the wells 4b and 4c and a portion of the underlying buried layer 3. As a result, the CMOS section in which PMOS and NMOS transistors are formed is electrically isolated from the rest of the structure and thus from the bipolar section or well 4a in which the NPN transistor is formed. With this structure, different power supply voltages may be applied to the CMOS and bipolar sections.

Figure 3:
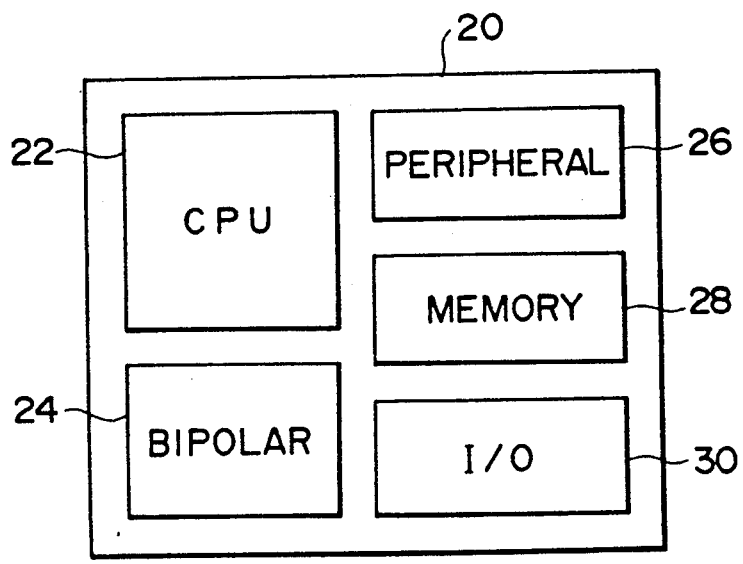
FIGS. 3 through 6 are schematic illustrations showing several examples of arrangement of various functional sections in a semiconductor integrated circuit chip embodying the present invention.
Figure 4:
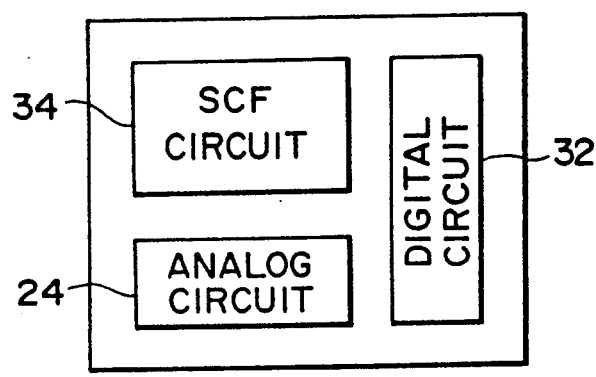
Figure 5:
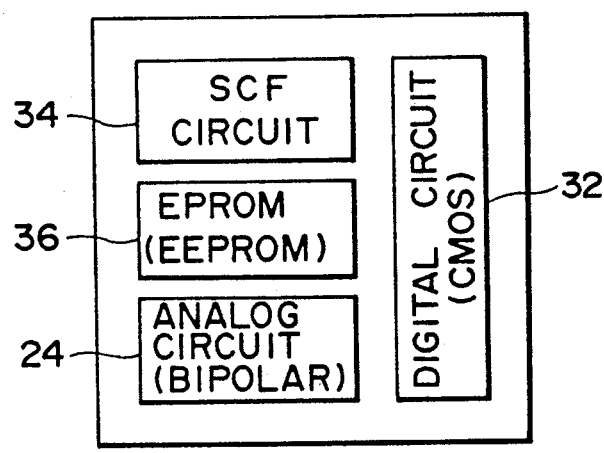
Figure 6:
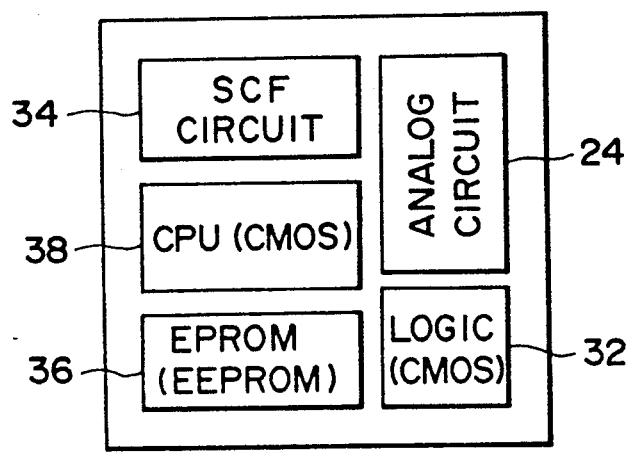

FIG. 3 schematically illustrates one example of the arrangement of various functional device elements in a semiconductor integrated circuit device constructed in accordance with one embodiment of the present invention employing a standard cell scheme. As shown, a chip 20 includes a bipolar section 24, a peripheral section 26, a memory section 28 and an I/O section 30, each in the form of a standard cell structure, as arranged as shown. The chip 20 has a masterslice structure having standard cell units and thus thus a desired logic function can be obtained by simply applying an interconnection pattern according to an automatic interconnection application scheme. In the bipolar section 24 is defined an analog circuit, such as a D/A converter, an A/D converter, a comparator or an operational amplifier. FIG. 4 illustrates another example which may also be fabricated according to the present invention. The structure shown in FIG. 4 includes a digital circuit 32 having a CMOS structure, an analog circuit 24 having a bipolar structure and a switched capacitor filter (SCF) circuit 34. FIG. 5 shows a further example of the present invention in which an EPROM or EEPROM 36 is additionally provided. FIG. 6 shows a still further example of a semiconductor integrated circuit device which may be advantageously fabricated according to the present invention and which includes an analog circuit 24, a logic circuit 32, a SCF circuit 34, a CPU 38 having a CMOS structure and an EPORM or EEPROM 36.

A SCF circuit can be formed by using a MOS manufacturing process and it is an integrated circuit comprised of a logic circuit and an analog filter; however, when use is made of a MOS transistor, there arises a problem of increasing the noise of a MOS transistor. Under the circumstances, in accordance with the present invention, not only a SCF circuit, but also a bipolar transistor are manufactured according to a standard cell scheme, the noise of a MOS transistor may be reduced. A SCF circuit may be used as a kind of interface between an analog information source and a digital signal processor (DSP) circuit. In accordance with the present embodiment, a bipolar transistor, a CMOS structure and a SCF circuit can be formed in the same chip, so that there can be provided a one-chip semiconductor integrated circuit device for communication control processing or voice data processing.

Figure 7:
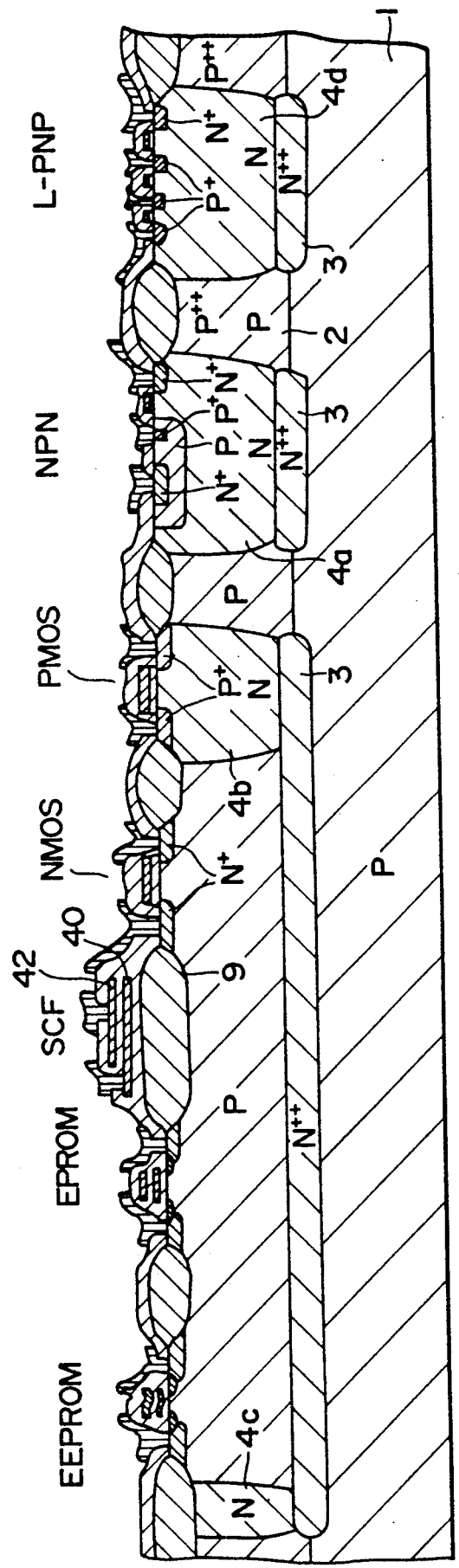
FIG. 7 is a schematic, cross sectional view showing the structure of a semiconductor integrated circuit device constructed in accordance with one embodiment of the present invention.

FIG. 7 schematically illustrates the structure of a semiconductor integrated circuit device constructed in accordance with one embodiment of the present invention which may be found in any of the structure shown in FIGS. 4 through 6. As shown, the device includes a P type silicon substrate 1 on which is formed a P type epitaxial layer 2 which is formed with wells 4a, 4b, 4c and 4d at selected locations. A buried layer 3 is formed between the substrate 1 and the epitaxial layer 2 at selected portions. It is to be noted that each of these wells 4a through 4c extends through the epitaxial layer 2 from the top surface of the epitaxial layer 2 to the underlying buried layer 3. An NPN transistor is formed within the well 4a and a lateral PNP transistor is formed inside of the well 4d with a PMOS transistor being formed within the well 4b. In addition, a portion of the epitaxial layer 2 which is surrounded by the buried layer 3 and the wells 4b and 4c is formed with an NMOS transistor, together with an EPROM and an EEPROM. Besides, a SCF circuit including a double-decked polysilicon layers 40 and 42 is formed on the field oxide film 9.

The SCF circuit may be defined by adding steps for forming the polysilicon layer 40 and the polysilicon layer 42 to a conventional Bi-CMOS process of the N well type. By appropriately selecting each section of the structure shown in FIG. 7, a semiconductor integrated circuit device having any of the arrangements as shown in FIGS. 4 through 6 can be fabricated according to a standard cell scheme.

Figure 8A:
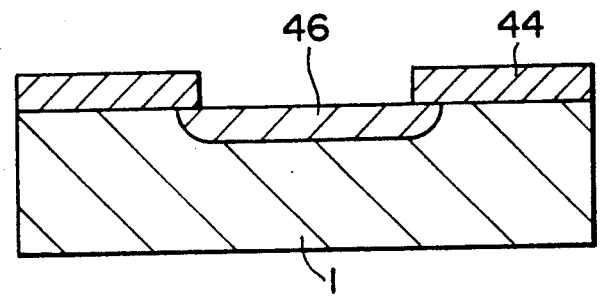
FIGS. 8a through 8c are schematic, cross sectional views showing steps of a method for manufacturing a bipolar transistor in accordance with another embodiment of the present invention.

Now, a method for improving the current-voltage characteristic of a bipolar transistor in a semiconductor integrated circuit device containing both of a bipolar transistor and a MOS transistor and increasing the degree of freedom in its manufacturing process according to one aspect of the present invention will be described below with reference to FIGS. 8a through 8c. As shown in FIG. 8a, there is first provided a P type silicon substrate 1 and a thermal oxide film 44 is formed at the surface of the substrate 1. And then that portion of the oxide film 44 in which a buried layer is to be formed is removed by photolithography and etching. Thereafter, impurities for forming a buried layer, such as antimony, arsenic or phosphorus, are introduced into the substrate 1 through an opening defined by removing a portion of the oxide film 44, for example, by ion implantation or diffusion to thereby define a diffusion region 46. In this case, for example, antimony and phosphorus are diffused in the diffusion region 46.

Figure 8B:
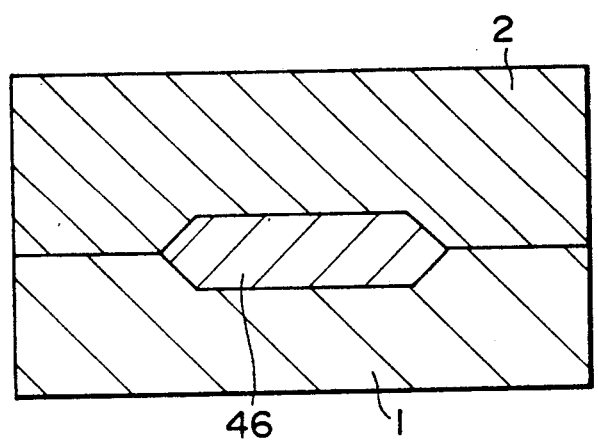

Then, after removing the entire oxide film 44, a monocrystalline silicon layer 2 is formed on the substrate 1 and also on the buried layer 1 using an epitaxial technique, as shown in FIG. 8b. And, then, as shown in FIG. 8c, a collector 4 is formed in the epitaxial layer 2 and a base 7 is formed in the collector 4. And then an emitter 8 is formed in the base 7 to define an NPN transistor. In this case, at the bottom portion of the N type well of collector 4, phosphorus diffuses as indicated by the dotted line 46b, so that the concentration of phosphorus at the bottom portion of the well 4 can be increased over a relatively wide range. In the structure shown in FIG. 8c, 46a indicates an antimony buried layer. With this structure, there is obtained an increased rising characteristic of a bipolar transistor. In accordance with a process shown in FIGS. 8a through 8c, no constraints are imposed by a film thickness or thermal processing conditions and there can be obtained a bipolar transistor having an improved characteristic, so that there can be obtained a Bi-CMOS structure without any sacrifice to the characteristic of a MOS transistor.

Figure 8C:
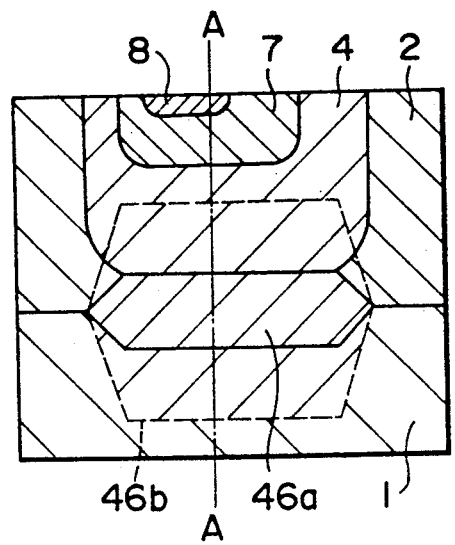
Figure 9:
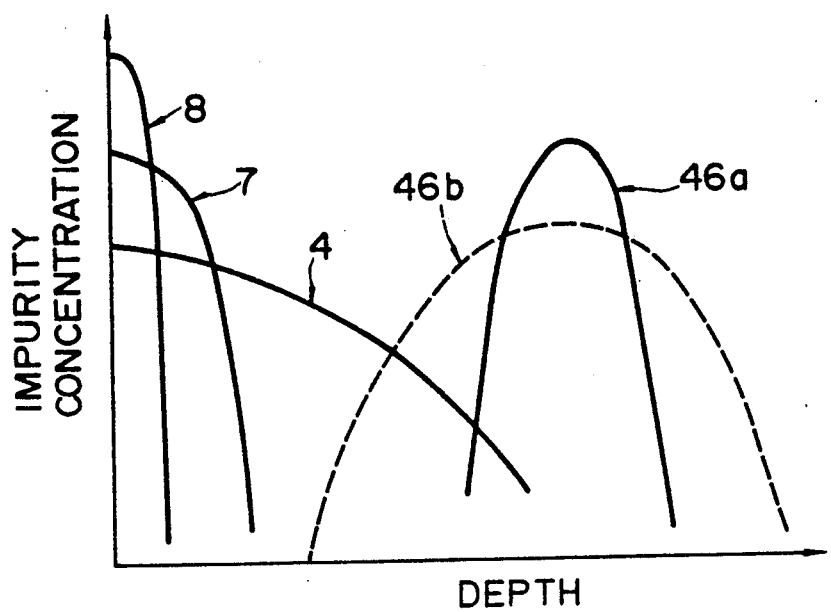
FIG. 9 is a graph showing distributions of impurities in the structure shown in FIG. 8c.

FIG. 9 illustrates a graph showing concentration distributions of various impurities along line A—A indicated in FIG. 8.

Figure 10:
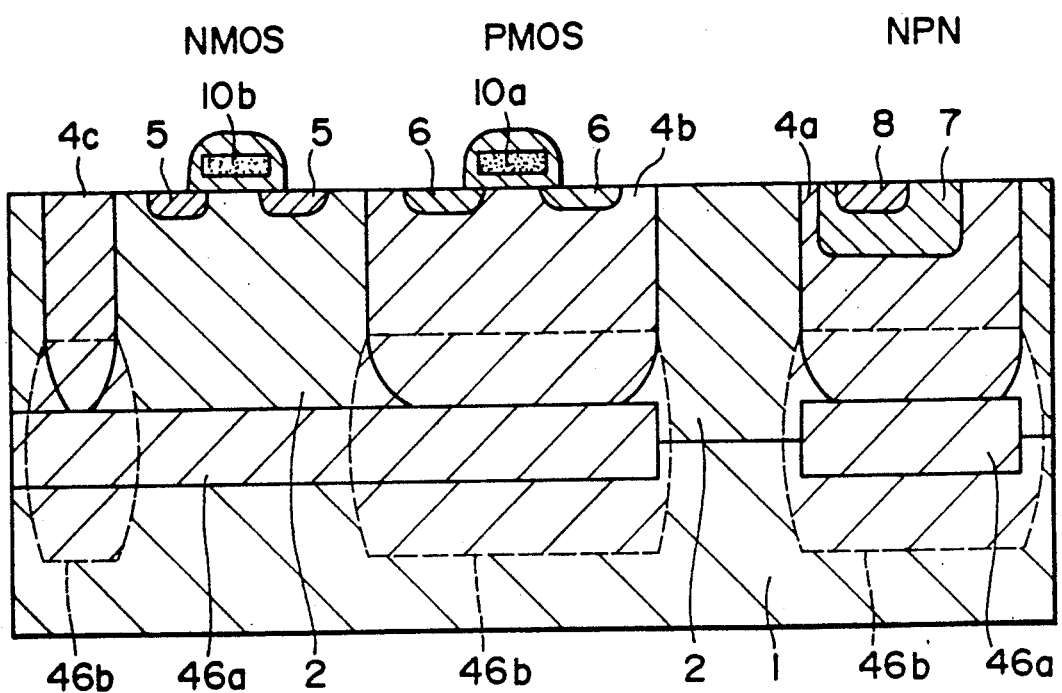
FIG. 10 is a schematic, cross sectional view showing the structure of a semiconductor integrated circuit device constructed in accordance with a further embodiment of the present invention.

FIG. 10 illustrates the structure of a Bi-CMOS device which can be obtained by applying the novel structure shown in FIG. 8c to the structure shown in FIG. 1c. As compared with FIG. 1c, the buried layer in the structure shown in FIG. 10 has a duplex structure including an antimony buried layer 46a and a phosphorus buried layer 46b. This process is advantageous in that the MOS transistor section and the bipolar transistor section can be maintained to be completely isolated from each other even if the epitaxial layer 2 is made relatively thicker for various reasons. Described more in detail with respect to the structure shown in FIG. 10, the substrate 1 is of the P type and has a resistivity in the order of 10 ohms-cm. The epitaxial layer 2 formed on the substrate 1 has the P conductivity type and has a resistivity in the order of 6 ohms-cm. The epitaxial layer 2 should have a thickness of at least 5 microns and preferably about 7.5 microns. The well 4a is a bipolar N type well which is formed by implanting phosphorus with dose of $2.3 \times 10^{12}$ 1/cm$^2$ at energy of 160 KeV. The well 4b is a MOS N type well which is formed by implanting phosphorus with dose of $6 \times 10^{12}$ 1/cm$^2$ at energy of 160 KeV. The base 7 is formed by implanting boron with dose of $7 \times 10^{13}$ 1/cm$^2$ at energy of 60 KeV. The emitter 8 is formed by implanting arsenic with dose of $1 \times 10^{16}$ 1/cm$^2$ at energy of 70 KeV. The source and drains 5, 5 are formed by implanting arsenic with dose of $6 \times 10^{15}$ 1/cm$^2$ at energy of 70 KeV. The source and drains 6, 6 are formed by implanting BF2 with dose of $3 \times 10^{15}$ 1/cm$^2$ at energy of 50 KeV. The PMOS polysilicon gate 10a preferably has a thickness in the order of 3,500 angstroms and the NMOS polysilicon gate 10b preferably has a thickness in the order of 3,500 angstroms. The buried N++ layer 46a is preferably formed by implanting antimony and the outer buried layer 46b is preferably defined by outdiffusion.

As described above, in accordance with the present invention, bipolar and MOS transistors are formed in the same semiconductor structure as electrically isolated from each other by buried layers and wells reaching the buried layers. As a result, each of bipolar and MOS transistor sections in the semiconductor structure is electrically isolated completely, so that different power supply voltages may be applied to the bipolar and MOS sections. Since the bipolar and MOS sections are isolated from each other, both of the bipolar and MOS sections may be constructed in the form of a standard cell structure, and thus there can be manufactured a semiconductor integrated circuit device containing both of bipolar and MOS transistors in accordance with a standard cell scheme. Accordingly, the time of developing a custom Bi-CMOS IC can be reduced and such a custom Bi-CMOS device can be manufactured at low price and in short time.

While the above provides a full and complete disclosure of the preferred embodiments of the present invention, various modifications, alternate constructions and equivalents may be employed without departing from the true spirit and scope of the invention Therefore, the above description and illustration should not be construed as limiting the scope of the invention, which is defined by the appended claims.

What is claimed is:

1. A masterslice structure having standard cells, comprising:
    a substrate of a first conductivity type;
    a plurality of buried layers of a second conductivity type formed on selected portions of said substrate;
    an epitaxial layer of said first conductivity type formed on said substrate and said plurality of buried layers, said epitaxial layer having a predetermined thickness;
    a plurality of wells of said second conductivity type formed in said epitaxial layer, each of said plurality of wells extending from a top surface of said epitaxial layer to a corresponding one of said plurality of buried layers to thereby define a plurality of electrically isolated islands in said epitaxial layer;
    bipolar devices formed in one of said wells;
    MOS devices comprising MOS transistors of said first conductivity type formed in one of said wells, and MOS transistors of said second conductivity type formed in one of said isolated islands;
    wherein the only MOS devices of said second conductivity type are formed in said isolated islands;
    bipolar standard cells, each comprising at least one of said bipolar devices; and
    MOS standard cells, each comprising at least one of said MOS devices.

2. The device of claim 1 wherein at least one of said plurality of isolated islands is formed by a single one of said plurality of wells.

3. The device of claim 1 wherein at least one of said plurality of isolated islands is formed by a portion of said epitaxial layer which is surrounded by one of said buried layers and at least one of said plurality of wells in contact with said one buried layer.

4. The device of claim 1 wherein said plurality of buried layers contain at least two different kinds of impurities of said second conductivity type.

5. The device of claim 1 wherein said predetermined thickness of said epitaxial layer is at least 5 microns.

6. The device of claim 5 wherein said predetermined thickness of said epitaxial layer is approximately 7.5 microns.

* * * * *